United States Patent
Farid et al.

(10) Patent No.: US 10,727,857 B2
(45) Date of Patent: Jul. 28, 2020

(54) SUCCESSIVE APPROXIMATION REGISTER (SAR) ANALOG TO DIGITAL CONVERTER (ADC) WITH SWITCHABLE REFERENCE VOLTAGE

(71) Applicant: SHENZHEN GOODIX TECHNOLOGY CO., LTD., Shenzhen (CN)

(72) Inventors: Ali Farid, San Diego, CA (US); Ahmed Emira, San Diego, CA (US); Mohamed Aboudina, San Diego, CA (US); Hassan Elwan, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/560,939

(22) Filed: Sep. 4, 2019

(65) Prior Publication Data
US 2020/0007143 A1 Jan. 2, 2020

Related U.S. Application Data

(63) Continuation of application No. 15/993,623, filed on May 31, 2018, now Pat. No. 10,461,767.

(51) Int. Cl.
*H03M 1/38* (2006.01)
*H03M 1/46* (2006.01)
(Continued)

(52) U.S. Cl.
CPC .......... *H03M 1/462* (2013.01); *H03M 1/466* (2013.01); *H03M 1/00* (2013.01); *H03M 1/06* (2013.01); *H03M 1/10* (2013.01); *H03M 1/12* (2013.01)

(58) Field of Classification Search
CPC ............ H03M 1/00; H03M 1/12; H03M 1/10; H03M 1/06
(Continued)

(56) References Cited

U.S. PATENT DOCUMENTS

2002/0140594 A1* 10/2002 Seymour ............... H03M 1/804
341/150
2010/0259432 A1* 10/2010 Ishikawa ............... H03M 1/468
341/144

OTHER PUBLICATIONS

European Search Report dated Aug. 21, 2019 in the corresponding EP application (application No. 18806959.5).
(Continued)

*Primary Examiner* — Joseph J Lauture
(74) *Attorney, Agent, or Firm* — Kilpatrick Townsend & Stockton LLP

(57) ABSTRACT

An ADC is disclosed. The ADC includes a SAR logic circuit, a DAC, a comparator, and a voltage generator. The voltage generator includes a first switch connected to the comparator configured to selectively connect a second input terminal of the comparator to a reference voltage, a capacitor connected to the second input terminal of the comparator, and a second switch connected to the capacitor and selectively connected to either of a ground voltage and the reference voltage. The second switch is configured to selectively connect the capacitor to either of the ground voltage and the reference voltage, and the SAR logic circuit is further configured to receive the comparator output voltage, and to generate a digital input word for the DAC based on one or more comparator output voltages received from the comparator.

21 Claims, 5 Drawing Sheets

(51) Int. Cl.
  *H03M 1/00* (2006.01)
  *H03M 1/06* (2006.01)
  *H03M 1/10* (2006.01)
  *H03M 1/12* (2006.01)

(58) Field of Classification Search
  USPC .................................. 341/161, 155, 120, 118
  See application file for complete search history.

(56) References Cited

OTHER PUBLICATIONS

He Xiaoyong et al: "A low power switching method with variable comparator reference voltage and split capacitor array for SAR ADC", 1-6,9-1!: Inv. 2016 IEEE International Conference on Electron Devices and Solid-State Circuits (EDSSC). IEEE, Aug. 3, 2016 (Aug. 3, 2016), pp. 379-382, XP033026446.

Khoshakhlagh Mohammad et al: "An efficient threshold voltage generation for SAR ADCs", Analog Integrated Circuits and Signal Processing, Springer New York LLC, US, vol. 75, No. 1, Jan. 24, 2013 (Jan. 24, 2013), pp. 161-169, XP035311723.

EP First Office Action dated Apr. 24, 2020 in the corresponding EP application (application No. 18806959.5).

Chris Schell: "Voltage Doubler Design and Analysis", Jun. 30, 2001 (Jun. 30, 2001), pp. 1-6, XP055460511, Retrieved from the Internet: URL:http://www.ti.com/lit/an/snaa095/snaa095.pdf [retrieved on Mar. 19, 2018].

Anonymous: "Voltage doubler—Wikipedia", Nov. 15, 2017 (Nov. 15, 2017), XP055687514, Retrieved from the Internet: URL:https://en.wikipedia.org/w/index.php?title=Voltage_doubler&oldid=810405403 [retrieved on Apr. 20, 2020].

\* cited by examiner

SUCCESSIVE APPROXIMATION REGISTER (SAR) ANALOG TO DIGITAL CONVERTER (ADC) WITH SWITCHABLE REFERENCE VOLTAGE

REFERENCES TO RELATED APPLICATIONS

This application is a Continuation of U.S. application Ser. No. 15/658,242, for "GaN CIRCUIT DRIVERS FOR GaN CIRCUIT LOADS" filed on Jul. 24, 2017, which is hereby incorporated by reference in its entirety for all purposes.

FIELD OF THE INVENTION

The present invention relates generally to a successive approximation register (SAR) analog to digital converter (ADC), and more particularly to a SAR ADC which has a reference voltage which is about half the voltage of the difference between the maximum input voltage and the minimum input voltage.

BACKGROUND OF THE INVENTION

Conventional SAR ADC architectures use reference voltages which are equal to or are substantially equal to the maximum input voltage. Because the reference voltage is used in a capacitive digital to analog converter (CDAC), the power used by the CDAC is significantly affected by the value of the reference voltage. In addition, power and latency are affected by the number of clock cycles required by the SAR to complete the conversion.

BRIEF SUMMARY OF THE INVENTION

One inventive aspect is a successive approximation register (SAR) analog to digital converter (ADC). The SAR ADC includes a SAR logic circuit configured to generate a digital input word, and a DAC, configured to receive the digital input word and an analog input voltage, and to generate a first voltage based on the analog input voltage and the digital input word. The SAR ADC also includes a comparator, including a first input terminal configured to receive the first voltage, and a second input terminal configured to receive a second voltage, where the comparator is configured to generate a comparator output voltage based on the first and second voltages, and where the comparator output voltage has a value corresponding with a sign of the difference between the first and second voltages. The SAR ADC also includes a voltage reference generator, configured to generate the second voltage, where the SAR logic circuit is further configured to receive the comparator output voltage, and to generate the digital input word for the DAC based on one or more comparator output voltages received from the comparator.

In some embodiments, the voltage reference generator includes a first switch connected to the second input terminal of the comparator configured to selectively connect the second input terminal to a reference voltage, a capacitor connected to the second input terminal of the comparator, and a second switch connected to the capacitor and selectively connected to either of a ground voltage and the reference voltage, where the second switch is configured to selectively connect the capacitor to either of the ground voltage and the reference voltage.

In some embodiments, the SAR logic is configured to determine the MSB of the digital output word by comparing the analog input voltage with the reference voltage.

In some embodiments, the SAR logic is configured to determine whether the digital input word causes the DAC to generate the first voltage such that the first voltage is greater than or is less than the analog input voltage based on whether the analog input voltage is determined to be less than or greater than the reference voltage by the comparator.

In some embodiments, the first voltage is substantially equal to the analog input voltage plus a voltage determined by the digital input word.

In some embodiments, the DAC includes a plurality of capacitors and a plurality of switches, where each of the switches is connected to a particular one of the capacitors, is selectively connected to either of a ground voltage and the reference voltage, and is configured to selectively connect the particular capacitor to either of the ground voltage and the reference voltage.

In some embodiments, the SAR logic is configured to cause the DAC to generate the first voltage such that the first voltage is equal to the analog input voltage, where while the first voltage is generated, the switches of the DAC and the second switch are connected to the ground voltage.

In some embodiments, the SAR logic is configured to, in response to the analog input voltage being greater than the reference voltage, cause the switches of the DAC and the second switch to become connected to the reference voltage.

In some embodiments, the SAR logic is configured to cause the DAC to generate the first voltage such that the first voltage is equal to the analog input voltage, where while the first voltage is generated, the switches of the DAC and the second switch are connected to the reference voltage.

In some embodiments, the SAR logic is configured to, in response to the analog input voltage being less than the reference voltage, cause the switches of the DAC and the second switch to become connected to the ground voltage.

In some embodiments, the SAR logic is further configured to generate a digital output word based on a plurality of comparator output voltages received from the comparator, where the digital output word represents the value of the analog input voltage.

Another inventive aspect is a method of determining a digital output word having a value corresponding with an analog input value with a successive approximation register (SAR) analog to digital converter (ADC). The method includes, with a SAR logic circuit of the SAR ADC, generating a digital input word, and with a DAC of the SAR ADC receiving a digital input word and an analog input voltage, and generating a first voltage based on the analog input voltage and the digital input word. The method also includes, with a comparator of the SAR ADC receiving the first voltage at a first input terminal, and receiving a reference voltage, and generating a second voltage based on the first voltage and on the reference voltage, where the second voltage has a value corresponding with a sign of the difference between the first voltage and the reference voltage. The method also includes, with a voltage generator, generating the second voltage, and, with an SAR logic circuit of the SAR ADC receiving the comparator output voltage, generating the digital input word for the DAC based on one or more comparator output voltages received from the comparator, and generating a digital output word based on the comparator output voltages, where the digital output word represents the value of the analog input voltage.

In some embodiments, generating the second voltage includes with a first switch, selectively connecting the second input terminal to a reference voltage, and with a second switch, selectively connecting a capacitor connected to the second input terminal of the comparator to either of the ground voltage and the reference voltage.

In some embodiments, the method further includes, with the SAR logic, determining the MSB of the digital output word by comparing the analog input voltage with the reference voltage.

In some embodiments, the method further includes, with the SAR logic, determining whether the digital input word causes the DAC to generate the first voltage such that the first voltage is greater than or is less than the analog input voltage based on whether the analog input voltage is determined to be less than or greater than the reference voltage by the comparator.

In some embodiments, the first voltage is substantially equal to the analog input voltage plus a voltage determined by the digital input word.

In some embodiments, the DAC includes a plurality of capacitors and a plurality of switches, where each of the switches is connected to a particular one of the capacitors, and is selectively connected to either of a ground voltage and the reference voltage, and the method further includes, with the switches of the DAC, selectively connecting each of the capacitors of the DAC to either the ground voltage or the reference voltage.

In some embodiments, the method further includes, with the SAR logic, causing the DAC to generate the first voltage such that the first voltage is equal to the analog input voltage, where while the first voltage is generated, the switches of the DAC and the second switch are connected to the ground voltage.

In some embodiments, the method further includes, with the SAR logic, in response to the analog input voltage being greater than the reference voltage, causing the switches of the DAC and the second switch to become connected to the reference voltage.

In some embodiments, the method further includes, with the SAR logic, in response to the analog input voltage being less than the reference voltage, causing the switches of the DAC and the second switch to remain connected to the ground voltage.

In some embodiments, the method further includes, with the SAR logic, causing the DAC to generate the first voltage such that the first voltage is equal to the analog input voltage, where while the first voltage is generated, the switches of the DAC and the second switch are connected to the reference voltage.

In some embodiments, the method further includes, with the SAR logic, in response to the analog input voltage being less than the reference voltage, causing the switches of the DAC and the second switch to become connected to the ground voltage.

In some embodiments, the method further includes, with the SAR logic, in response to the analog input voltage being less than the reference voltage, causing the switches of the DAC and the second switch to become connected to the reference voltage.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

The present invention is related to an SAR ADC. The SAR ADC determines a corresponding digital value for an analog input based on a successive approximation system. A particular embodiment of the SAR ADC is designed to generate digital values for analogue inputs ranging between a minimum input value and a maximum input value. As discussed in further detail below, the successive approximation system uses a reference voltage value to generate the digital values. In the embodiments discussed, the reference voltage is approximately or substantially equal to 1 half the difference between the maximum input value and the minimum input value.

Figure 1:
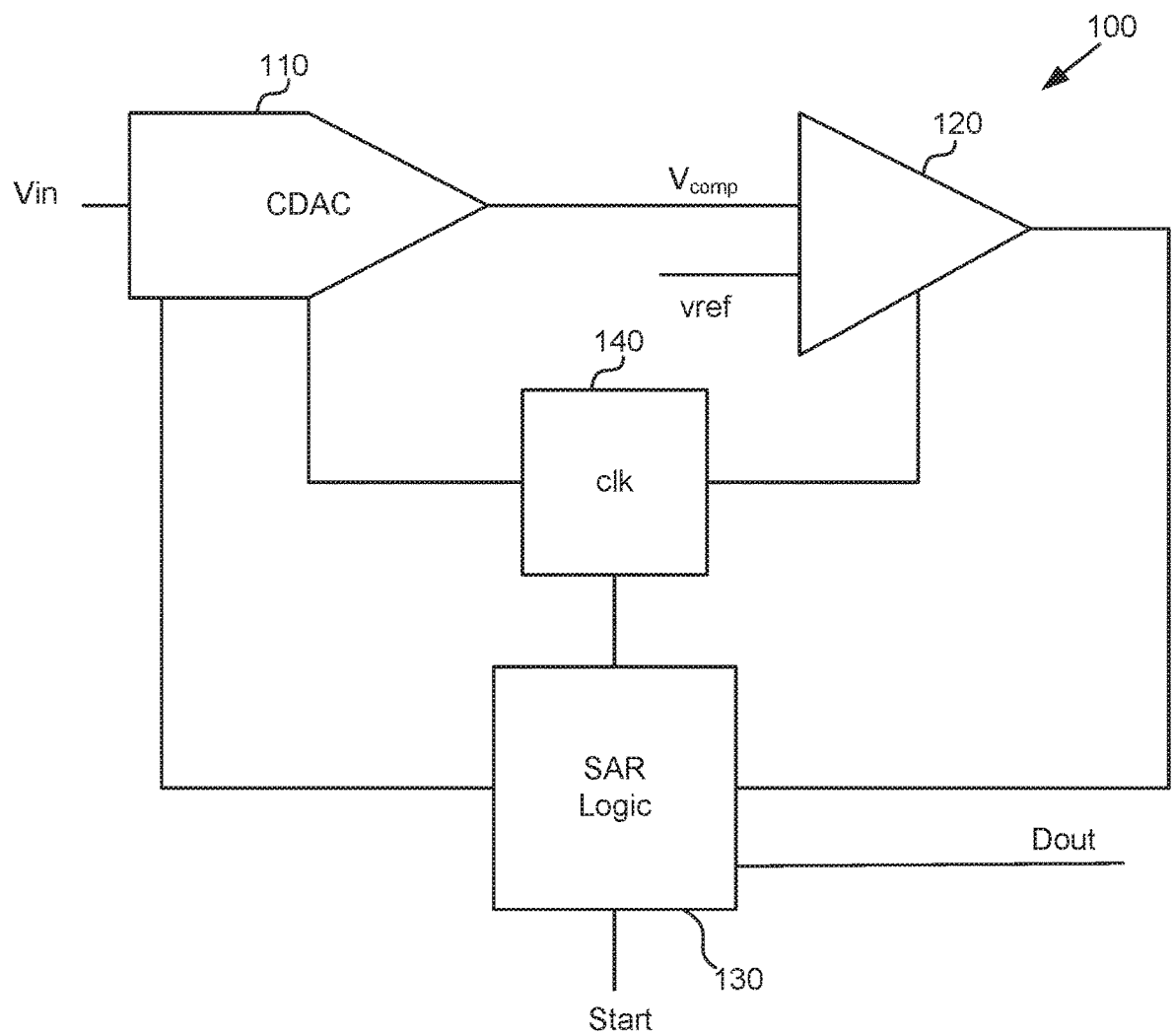
FIG. 1 is a schematic illustration of an SAR ADC according to one embodiment.

FIG. 1 is a schematic illustration of an SAR ADC 100 according to one embodiment. SAR ADC 100 includes CDAC 110, comparator 120, SAR logic 130 and clock generator 140.

SAR ADC 100 receives an analog input value at Vin. In response to a start signal, SAR ADC 100 calculates and generates a digital value corresponding with the analog input value Vin. Once calculated, SAR ADC 100 provides the digital value as output word Dout.

To determine the digital value, SAR ADC 100 determines a most significant bit (MSB), and subsequently determines each of the other bits of the digital output word. To determine the MSB, in response to one or more clock signals from clock generator 140, the analog input voltage Vin is provided to comparator 120 as voltage Vcomp, and comparator 120 compares voltage Vcomp with reference voltage Vref and generates an output voltage corresponding with the results of the comparison. In addition, in response to one or more clock signals from clock generator 140, SAR logic 130 receives the output from the comparator 120, and determines and stores an MSB based on the output from the comparator 120.

To determine each of the other bits of the digital output word, in response to each of one or more clock signals from clock generator 140, SAR logic 130 determines a next digital input word for CDAC 110, and CDAC 110 generates a next voltage Vcomp. In addition, in response to each of one or more clock signals from clock generator 140, comparator 120 compares the next voltage Vcomp with reference voltage Vref and generates an output voltage corresponding with the results of the comparison. Furthermore, in response to one or more clock signals from clock generator 140, SAR logic 130 receives the output from the comparator 120, and determines whether a next digital input word for CDAC 110 should be generated.

In some embodiments, in may be beneficial to determine whether the analog input voltage Vin is greater than or is less than the reference voltage Vref. In such embodiments, the comparison used to determine the MSB may be used as an indication of whether the analog input voltage Vin is greater than or is less than the reference voltage Vref.

In some embodiments, SAR logic 130 uses the information regarding whether the analog input voltage Vin is greater than or is less than the reference voltage Vref to determine a next digital input word for CDAC 110. For example, SAR logic 130 may use the information regarding whether the analog input voltage Vin is greater than or is less than the reference voltage Vref to determine whether each next Vcomp should be greater than the analog input voltage Vin or should be less than the analog input voltage Vin.

If sufficient digital input words for CDAC 110 have been generated and corresponding comparison results has been received by SAR logic 130, SAR logic 130 determines that the digital output word may be generated and provided to output Dout. If sufficient digital input words for CDAC 110 and corresponding comparison results has been received by SAR logic 130, SAR logic 130 generates a next digital input port for CDAC 110.

SAR logic 130 may include circuitry configured to implement any of a number of SAR calculations. For example, SAR logic 130 may include circuitry configured to implement either a linear or a binary SAR calculation, as understood by those of ordinary skill in the art. The circuitry of SAR logic 130 may be designed and built using processes known to those of skill in the art.

Figure 2:
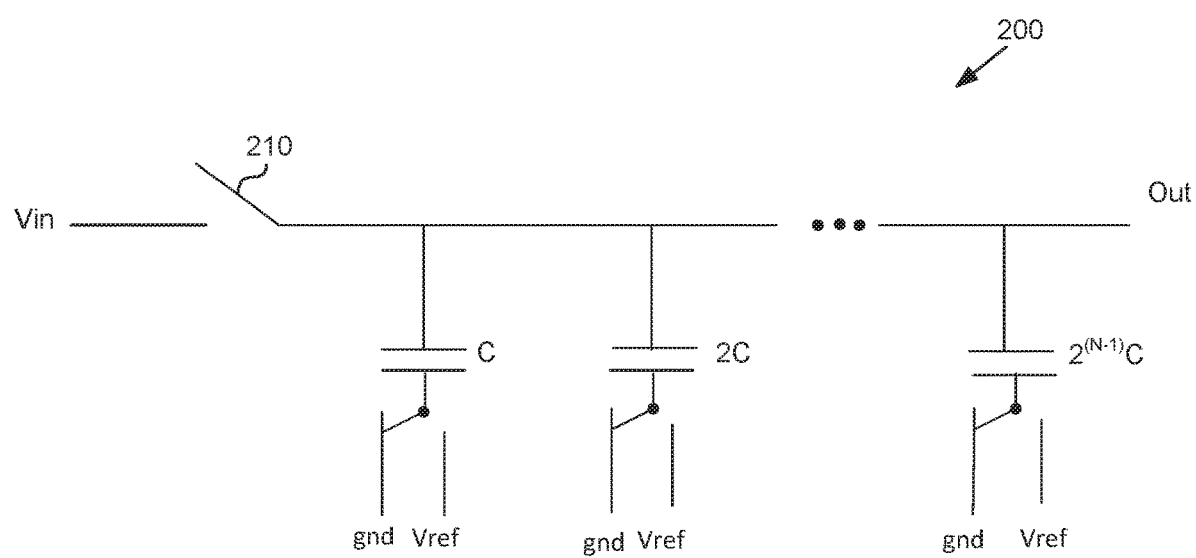
FIG. 2 is a schematic illustration of an embodiment of a CDAC which may be used in the SAR ADC of FIG. 1.

FIG. 2 is a schematic illustration of an embodiment of a CDAC 200 which may be used in the SAR ADC of FIG. 1. CDAC 200 includes switch 210 and an array of capacitors. The capacitors are by binarily waited, such that capacitors having values C, 2×C, 4×C, . . . $2^{(N-1)}$×C are included, where N is equal to the number of bits of resolution of CDAC 200. Each of the capacitors is connected to a switch configured to selectively connect the capacitor to either a ground voltage or a reference voltage Vref.

When used in the SAR ADC 100 illustrated in FIG. 1 to determine the MSB of the digital output word, switch 210 is closed such that the analog input voltage Vin is provided to comparator 120 as voltage Vcomp. In addition, while comparator 120 compares voltage Vcomp with reference voltage Vref, the switches connected to each of the capacitors are each connected to either the ground voltage or the reference voltage Vref, and are not changed during the comparison.

When used in the SAR ADC 100 illustrated in FIG. 1 to determine each of the other bits of the digital output word, during a first period, the output node out is charged to analog input voltage Vin through conducting switch 210 while the switches connected to each of the capacitors are each connected to either the ground voltage or the reference voltage Vref, and during a second period, switch 210 is opened and one or more of the switches are switched, such that the one or more capacitors connected to the one or more switches are then connected to the other of the ground voltage or the reference voltage.

For example, during the first period the output node may be charged to analog input voltage Vin through the switch 210, which is closed. Additionally, during the first period, the switch connected to the capacitor having weight C is connected to the ground voltage. Subsequently, during the second period, switch 210 is opened, and the switch connected to the capacitor having weight C is switched so as to be connected to the reference voltage Vref. As a result, the voltage at the output node out is increased from the analog input voltage Vin by an amount corresponding with the charge stored on the capacitor having weight C.

In some embodiments, CDAC 120 includes a sample and hold amplifier between the analog input and switch 210. When present, the sample and hold amplifier samples the analog input voltage Vin, stores the sample voltage, for example, using a capacitor, and drives the switch 210 with a voltage substantially equal to the stored voltage. Sample and hold amplifiers known to those of skill in the art may be used.

Similarly, in some embodiments, SAR ADC 100 may include a sample and hold amplifier between the analog input and CDAC 120. When present, the sample and hold amplifier samples the analog input voltage Vin, stores the sample voltage, for example, using a capacitor, and drives CDAC 120 with a voltage substantially equal to the stored voltage. Sample and hold amplifiers known to those of skill in the art may be used.

As another example, during the first period the output node may be charged to analog input voltage Vin through the switch 210, which is closed. Additionally, during the first period, the switch connected to the capacitor having weight C is connected to the reference voltage Vref. Subsequently, during the second period, switch 210 is opened, and the switch connected to the capacitor having weight C is switched so as to be connected to the ground voltage. As a result, the voltage at the output node out is decreased from the analog input voltage Vin by an amount corresponding with the charge stored on the capacitor having weight C.

Figure 3:
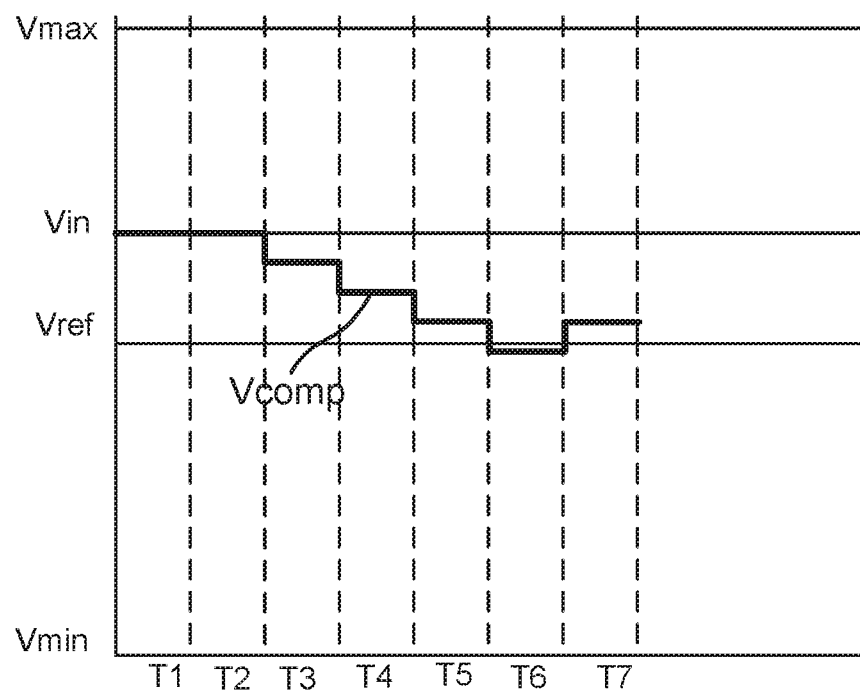
FIG. 3 is a waveform diagram illustrating operation of the SAR ADC of FIG. 1.

FIG. 3 is a waveform diagram illustrating operation of an embodiment of an SAR ADC, such as the SAR ADC 100 of FIG. 1. As shown, analog input voltage Vin is greater than a reference voltage Vref and is less than the maximum analog input voltage Vmax. In addition, as shown, reference voltage Vref is substantially equal to half the difference between maximum analog input voltage Vmax and minimum analog input voltage Vmin.

In the example illustrated in FIG. 3, the SAR ADC uses a linear search SAR method. As understood by those of skill in the art, other SAR methods, such as a binary search, may be used.

During the time period T1, CDAC 110 causes voltage Vcomp to be equal to or substantially equal to the analog voltage Vin, and comparator 120 generates a comparison value indicating that the analog voltage Vin is greater than the reference voltage Vref. In addition, based on the comparison value, SAR logic 130 determines the MSB of the digital output, and determines that subsequent values of voltage Vcomp will be less than the analog input value Vin.

During the time period T2, as a result of a digital input word from SAR logic 130, CDAC 110 causes voltage Vcomp to be equal to or substantially equal to the previous voltage Vcomp, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

In alternative embodiments, during time period T2, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In such embodiments, the operation of comparator 120 and SAR logic 130 remains unchanged.

During the time period T3, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T3, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T4, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T4, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T5, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T5, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T6, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T6, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

In some embodiments, because all the information for determining the digital output word is available after time period T6, the SAR logic 130 determines the digital output word according to principles and aspects discussed elsewhere herein and/or otherwise known to those of skill in the art.

In the exemplary embodiment of FIG. 3, during the time period T7, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C.

As a result of the voltage Vcomp being less than the voltage Vref during time period T6, the SAR logic 130 generates the digital output word corresponding to the analog input voltage Vin.

Because analog input voltage Vin was determined to be greater than the reference voltage Vref during time period T1, the MSB of the digital output word corresponds with that determination. In addition, because the digital input word from SAR logic 130 for CDAC 110 of time period T7 corresponds with the voltage difference between the reference voltage Vref and analog input voltage Vin, and the bits of the digital output word other than the MSB also correspond with the voltage difference between the reference voltage Vref and analog input voltage Vin, the digital input word from SAR logic 130 for CDAC 110 of time period T7 corresponds with the bits of the digital output word other than the MSB.

For example, if, in the example of FIG. 3, the maximum input voltage Vmax is 1 V, and the analog input voltage Vin is 0.74 V, a 4-bit digital word corresponding to the analog input voltage, may be 1011. The value of 1 for the MSB is determined during time period T1. In addition, because the digital input word from SAR logic 130 for CDAC 110 of time period T6 causes the voltage Vcomp to be equal to or substantially equal to the analog input voltage Vin, minus four voltage steps, where the magnitude of the voltage steps each correspond with the charge of the capacitor of CDAC 110 having value C, the other bits of the digital output word correspond with a voltage difference between the analog input voltage Vin and the reference voltage Vref, which corresponds digitally to 100. Accordingly, the digital output word is determined to be the expected 1011 because 0111+0100=1011, where 0111 represents the digitized value of the analog input voltage Vin minus four times the voltage corresponding with the charge of the capacitor of CDAC 110 having value C.

Once determined, the SAR ADC 100 represents the digital output word on the output Dout.

Figure 4:
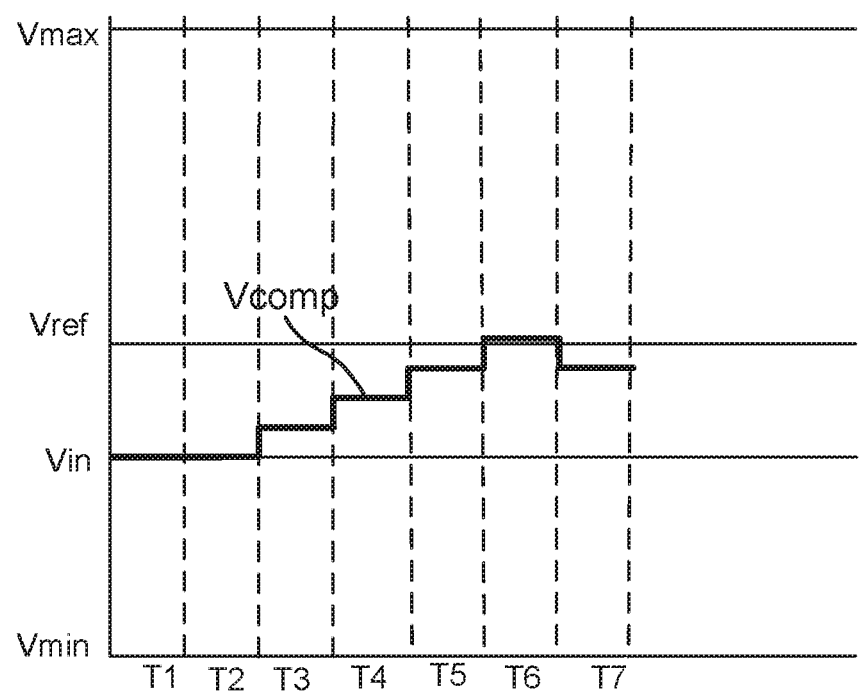
FIG. 4 is a waveform diagram illustrating operation of the SAR ADC of FIG. 1.

FIG. 4 is a waveform diagram illustrating operation of an embodiment of an SAR ADC, such as the SAR ADC 100 of FIG. 1. As shown, analog input voltage Vin is less than a reference voltage Vref and is less than the maximum analog input voltage Vmax. In addition, as shown, reference voltage Vref is substantially equal to half the difference between maximum analog input voltage Vmax and minimum analog input voltage Vmin.

In the example illustrated in FIG. 4, the SAR ADC uses a linear search SAR method. As understood by those of skill in the art, other SAR methods, such as a binary search, may be used.

During the time period T1, CDAC 110 causes voltage Vcomp to be equal to or substantially equal to the analog voltage Vin, and comparator 120 generates a comparison value indicating that the analog voltage Vin is less than the reference voltage Vref. In addition, based on the comparison value, SAR logic 130 determines the MSB of the digital output, and determines that subsequent values of voltage Vcomp will be greater than the analog input value Vin.

During the time period T2, as a result of a digital input word from SAR logic 130, CDAC 110 causes voltage Vcomp to be equal to or substantially equal to the previous voltage Vcomp, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

In alternative embodiments, during time period T2, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In such embodiments, the operation of comparator 120 and SAR logic 130 remains unchanged.

During the time period T3, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T3, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T4, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T4, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being greater than the voltage Vref.

During the time period T5, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T5, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T6, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T6, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

In some embodiments, because all the information for determining the digital output word is available after time period T6, the SAR logic 130 determines the digital output word according to principles and aspects discussed elsewhere herein and/or otherwise known to those of skill in the art.

In the exemplary embodiment of FIG. 4, during the time period T7, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. The digital input word from SAR logic 130 for CDAC 110 of time period T7 corresponds with the voltage difference between the reference voltage Vref and analog input voltage Vin.

As a result of the voltage Vcomp being greater than the voltage Vref during time period T6, the SAR logic 130 generates the digital output word corresponding to the analog input voltage Vin.

Because analog input voltage Vin was determined to be less than the reference voltage Vref during time period T1, the MSB of the digital output word corresponds with that determination. In addition, because the digital input word from SAR logic 130 for CDAC 110 of time period T7 corresponds with the voltage difference between the reference voltage Vref and analog input voltage Vin, and the bits of the digital output word other than the MSB also correspond with the voltage difference between the reference voltage Vref and analog input voltage Vin, the digital input word from SAR logic 130 for CDAC 110 of time period T7 corresponds with the bits of the digital output word other than the MSB.

For example, if, in the example of FIG. 4, the maximum input voltage Vmax is 1 V, and the analog input voltage Vin is 0.26 V, a 4-bit digital word corresponding to the analog input voltage, may be 0100. The value of 0 for the MSB is determined during time period T1. In addition, because the digital input word from SAR logic 130 for CDAC 110 of time period T6 causes the voltage Vcomp to be equal to or substantially equal to the analog input voltage Vin, plus four voltage steps, where the magnitude of the voltage steps each correspond with the charge of the capacitor of CDAC 110 having value C, the other bits of the digital output word correspond with a voltage difference between the analog input voltage Vin and the reference voltage Vref, which corresponds digitally to 100. Accordingly, the digital output word is determined to be the expected 0100 because 1000−0100=0100, where 1000 represents the digitized value of the analog input voltage Vin plus four times the voltage corresponding with the charge of the capacitor of CDAC 110 having value C.

Once determined, the SAR ADC 100 represents the digital output word on the output Dout.

Figure 5:
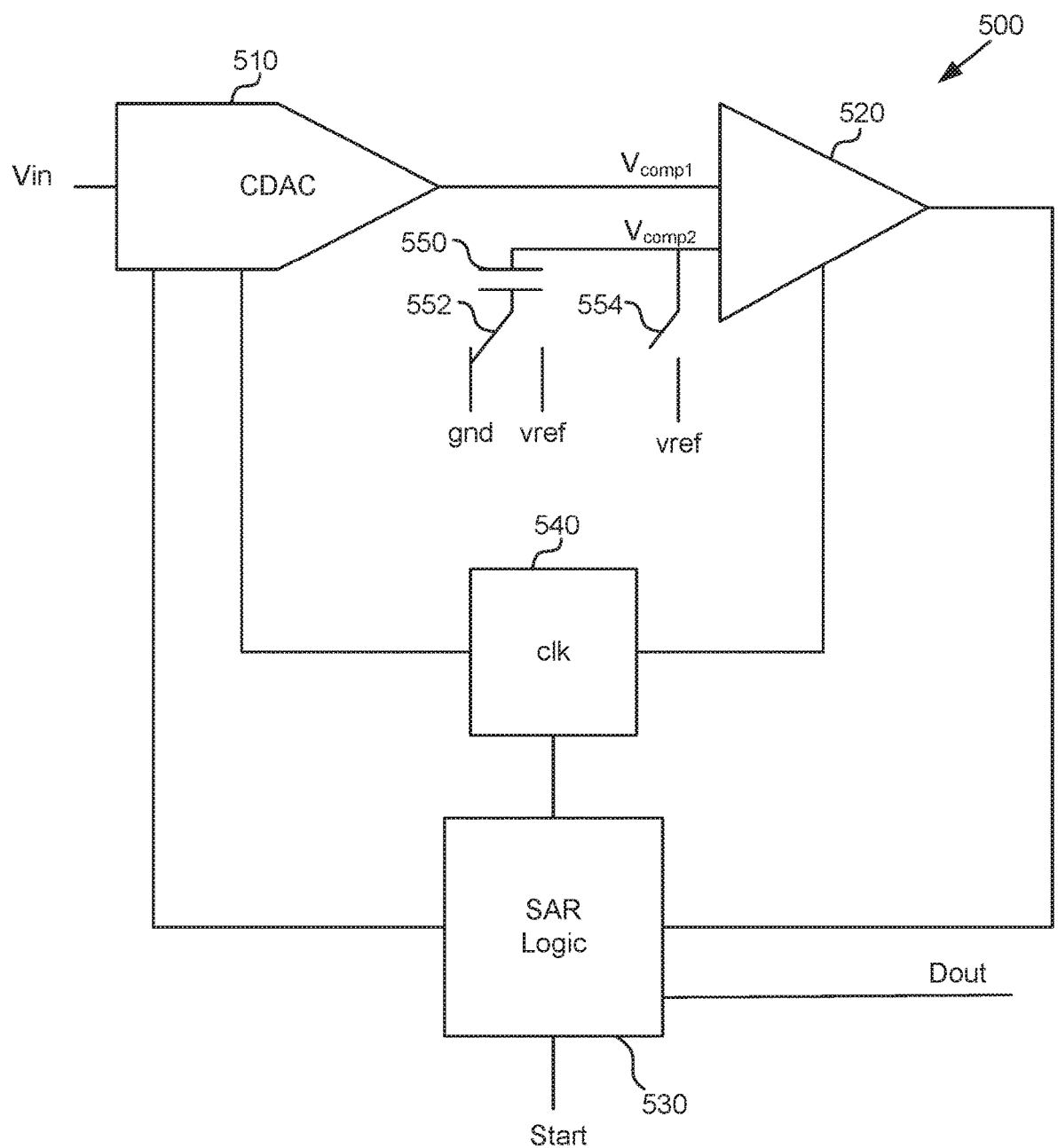
FIG. 5 is a schematic illustration of an SAR ADC according to an alternative embodiment.

FIG. 5 is a schematic illustration of an SAR ADC 500 according to one embodiment. SAR ADC 500 includes CDAC 510, comparator 520, SAR logic 530, and clock generator 540. In this embodiment, SAR ADC 500 also includes capacitor 550 and switches 552 and 554. Capacitor 550 and switches 552 and 554 collectively form a voltage reference generator configured to selectively generate one of two reference voltages, vref and 2× vref. In alternative embodiments, other circuits may be used to selectively generate one of the two reference voltages, vref and 2× vref. For example, a charge pump or a voltage doubler circuit may be used, as understood by those of skill in the art.

CDAC 510, comparator 520, SAR logic 530, and clock generator 540 may respectively be similar or identical to CDAC 110, comparator 120, SAR logic 130, and clock generator 140 of FIG. 1. Capacitor 550 and switches 552 and 554 may collectively form a voltage generator configured to provide a voltage Vcomp2.

SAR ADC 500 receives an analog input value at Vin. In response to a start signal, SAR ADC 500 calculates and generates a digital value corresponding with the analog input value Vin. Once calculated, SAR ADC 500 provides the digital value as output word Dout.

To determine the digital value, SAR ADC 500 determines a most significant bit (MSB), and subsequently determines each of the other bits of the digital output word.

To determine the MSB, in response to one or more clock signals from clock generator 540, the analog input voltage Vin is provided to comparator 520 at voltage Vcomp1, and comparator 520 compares voltage Vcomp1 with voltage Vcomp2 and generates an output voltage corresponding with the results of the comparison. In addition, in response to one or more clock signals from clock generator 540, SAR logic 530 receives the output from the comparator 520, and determines and stores an MSB based on the output from the comparator 520.

While the voltage Vin is provided to comparator 520, the switches of CDAC 510 (for example, see FIG. 2) may be connected to the gnd reference. In addition, SAR logic 530 may connect switch 552 to the gnd reference and may close switch 554 to be connected to the reference voltage Vref.

Alternatively, while the voltage Vin is provided to comparator 520, the switches of CDAC 510 (for example, see FIG. 2) may be connected to the reference voltage Vref. In addition, SAR logic 530 may connect switch 552 to the reference voltage Vref and may close switch 554 to be connected to the reference voltage Vref.

To determine each of the other bits of the digital output word, in response to each of one or more clock signals from clock generator 540, SAR logic 530 determines a next digital input word for CDAC 510, and CDAC 510 generates a next voltage Vcomp1. In addition, in response to each of one or more clock signals from clock generator 540, comparator 520 compares the next voltage Vcomp1 with reference Vcomp2 and generates an output voltage corresponding with the results of the comparison. Furthermore, in response to one or more clock signals from clock generator 540, SAR logic 530 receives the output from the comparator 520, and determines whether a next digital input word for CDAC 510 should be generated.

In some embodiments, in may be beneficial to determine whether the analog input voltage Vin is greater than or is less than the reference voltage Vref. In such embodiments, the comparison used to determine the MSB may be used as an indication of whether the analog input voltage Vin is greater than or is less than the reference voltage Vref.

In some embodiments, SAR logic 530 uses the information regarding whether the analog input voltage Vin is greater than or is less than the reference voltage Vref to determine a next digital input word for CDAC 510. For example, SAR logic 530 may use the information regarding whether the analog input voltage Vin is greater than or is less than the reference voltage Vref to determine whether each next Vcomp1 should be greater than the analog input voltage Vin or should be less than the analog input voltage Vin.

In addition, SAR logic 530 determines states for the switches of CDAC 510 and switches 552 and 554 in response to the information regarding whether the analog input voltage Vin is greater than or is less than the reference voltage Vref and whether the switches of CDAC 510 and switch 552 were connected to the gnd reference or to the reference voltage Vref while the voltage Vin was provided to comparator 520.

For example, in response to the analog input voltage Vin being less than the reference voltage Vref and switches of CDAC 510 and switch 552 having been connected to the gnd reference while the voltage Vin was provided to comparator 520, SAR logic 530 causes the switches of CDAC 510 and switch 552 to remain connected to the gnd reference and causes switch 554 to remain closed.

In response to the analog input voltage Vin being less than the reference voltage Vref and switches of CDAC 510 and switch 552 having been connected to the reference voltage Vref while the voltage Vin was provided to comparator 520, SAR logic 530 causes the switches of CDAC 510 and switch 552 to switch so as to be connected to the gnd reference and causes switch 554 to be open. Therefore, SAR logic 530 causes the voltages of both Vcomp1 and Vcomp2 to be reduced by the voltage of reference voltage Vref. Accordingly, even though the voltages of both Vcomp1 and Vcomp2 are reduced, they are reduced by substantially the same amount, and the result of the comparison is substantially not affected.

In response to the analog input voltage Vin being greater than the reference voltage Vref and switches of CDAC 510 and switch 552 having been connected to the gnd reference while the voltage Vin was provided to comparator 520, SAR logic 530 causes the switches of CDAC 510 and switch 552 to switch so as to be connected to the reference voltage Vref and causes switch 554 to be open. Therefore, SAR logic 530 causes the voltages of both Vcomp1 and Vcomp2 to be increased by the voltage of reference voltage Vref. Accordingly, even though the voltages of both Vcomp1 and Vcomp2 are increased, they are increased by substantially the same amount, and the result of the comparison is substantially not affected.

In response to the analog input voltage Vin being greater than the reference voltage Vref and switches of CDAC 510 and switch 552 having been connected to the reference voltage Vref while the voltage Vin was provided to comparator 520, SAR logic 530 causes the switches of CDAC 510 and switch 552 to remain connected to the reference voltage Vref and causes switch 554 to remain closed.

Once sufficient digital input words for CDAC 510 have been generated and corresponding comparison results have been received by SAR logic 530, SAR logic 530 determines that the digital output word may be generated and provided to output Dout, and does so. If sufficient digital input words for CDAC 510 and corresponding comparison results have been received by SAR logic 530, SAR logic 530 generates a next digital input port for CDAC 510.

SAR logic 530 may include circuitry configured to implement any of a number of SAR calculations. For example, SAR logic 530 may include circuitry configured to implement either a linear or a binary SAR calculation, as understood by those of ordinary skill in the art. The circuitry of SAR logic 530 may be designed and built using processes known to those of skill in the art.

Figure 6:
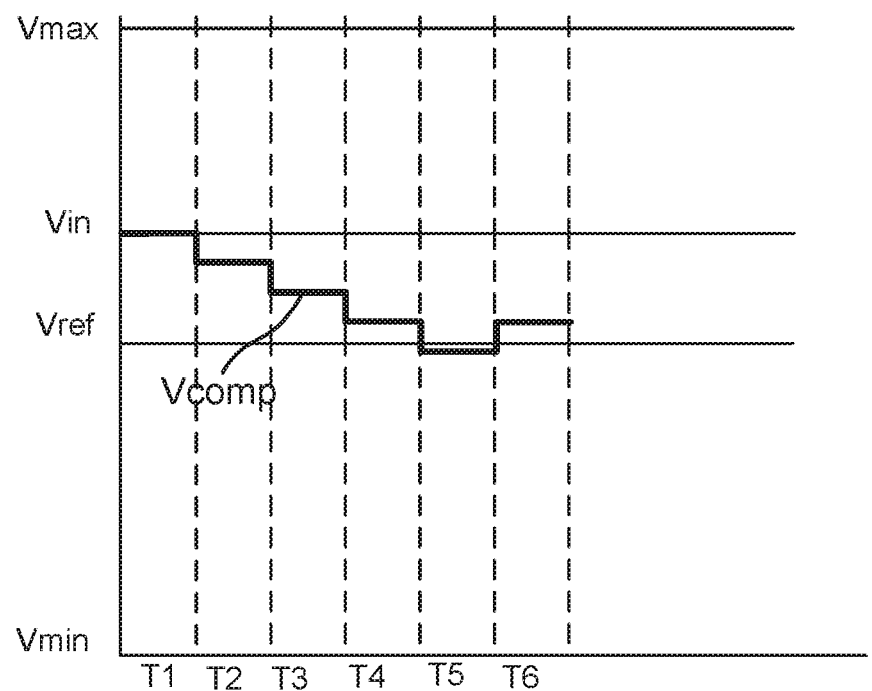
FIG. 6 is a waveform diagram illustrating operation of the SAR ADC of FIG. 5.

FIG. 6 is a waveform diagram illustrating operation of an embodiment of an SAR ADC, such as the SAR ADC 500 of FIG. 5. As shown, analog input voltage Vin is greater than a reference voltage Vref and is less than the maximum analog input voltage Vmax. In addition, as shown, reference voltage Vref is substantially equal to half the difference between maximum analog input voltage Vmax and minimum analog input voltage Vmin.

In the example illustrated in FIG. 3, the SAR ADC uses a linear search SAR method. As understood by those of skill in the art, other SAR methods, such as a binary search, may be used.

During the time period T1, the SAR logic 530 causes the switches of CDAC 510 and switch 552 to be connected either to the gnd reference or to the reference voltage Vref and causes switch 554 to be closed. In addition, CDAC 510 causes voltage Vcomp1 to be equal to or substantially equal to the analog voltage Vin. Further, comparator 520 generates a comparison value indicating that the analog voltage Vin is greater than the reference voltage Vref. Also, based on the comparison value, SAR logic 530 determines the MSB of the digital output, and determines that subsequent values of voltage Vcomp1 will be less than the analog input value Vin.

During the time period T2, as a result of the analog voltage Vin being greater than the reference voltage, if the SAR logic 530 caused the switches of CDAC 510 and switch 552 to be connected to the gnd reference, SAR logic 530 causes the switches of CDAC 510 and switch 552 to be connected to the reference voltage Vref and the voltages of both Vcomp1 and Vcomp2 are increased by the voltage of reference voltage Vref. Even though the voltages of both Vcomp1 and Vcomp2 are increased, they are increased by substantially the same amount, and the result of the comparison is substantially not affected. Otherwise, as a result of the analog voltage Vin being greater than the reference voltage, and the SAR logic 530 having caused the switches of CDAC 510 and switch 552 to be connected to the reference voltage Vref, SAR logic 530 causes the switches of CDAC 510 and switch 552 to remain connected to the reference voltage Vref and causes switch 554 to remain closed.

Also during the time period T2, as a result of a digital input word from SAR logic 530, CDAC 510 causes voltage Vcomp1 to be equal to or substantially equal to the previous voltage Vcomp1 minus a voltage step, where the magnitude of the voltage step corresponds with the charge of the capacitor of CDAC 510 having value C. Comparator 520 also generates a comparison value indicating that the voltage Vcomp1 is greater than the voltage Vref as a result of the voltage Vcomp1 being greater than the voltage Vref, and SAR logic 530 determines that the next Vcomp1 is to be less than the current Vcomp1 as a result of the voltage Vcomp1 being greater than the voltage Vref.

As understood by those of skill in the art, in some embodiments, switch of the capacitor of CDAC 510 having value C is not changed and changed again. Instead, the switch of the capacitor of CDAC 510 having value C may remain at the gnd reference.

During the time period T3, as a result of a next digital input word from SAR logic 530, CDAC 510 causes voltage Vcomp1 to be equal to or substantially equal to the previous voltage Vcomp1 minus a voltage step, where the magnitude of the voltage step corresponds with the charge of the capacitor of CDAC 510 having value C. In addition, during time period T3, comparator 520 generates a comparison value indicating that the voltage Vcomp1 is greater than the voltage Vref as a result of the voltage Vcomp1 being greater than the voltage Vref, and SAR logic 530 determines that the next Vcomp1 is to be less than the current Vcomp1 as a result of the voltage Vcomp1 being greater than the voltage Vref.

During the time period T4, as a result of a next digital input word from SAR logic 530, CDAC 510 causes voltage Vcomp1 to be equal to or substantially equal to the previous voltage Vcomp1, minus a voltage step, where the magnitude of the voltage step corresponds with the charge of the capacitor of CDAC 510 having value C. In addition, during time period T4, comparator 520 generates a comparison value indicating that the voltage Vcomp1 is greater than the voltage Vref as a result of the voltage Vcomp1 being greater than the voltage Vref, and SAR logic 530 determines that the next Vcomp1 is to be less than the current Vcomp1 as a result of the voltage Vcomp1 being greater than the voltage Vref.

During the time period T5, as a result of a next digital input word from SAR logic 530, CDAC 510 causes voltage Vcomp1 to be equal to or substantially equal to the previous voltage Vcomp1, minus a voltage step, where the magnitude of the voltage step corresponds with the charge of the capacitor of CDAC 510 having value C. In addition, during time period T6, comparator 520 generates a comparison value indicating that the voltage Vcomp1 is less than the voltage Vref as a result of the voltage Vcomp1 being less than the voltage Vref, and SAR logic 530 determines that the next Vcomp1 is to be greater than the current Vcomp1 as a result of the voltage Vcomp1 being less than the voltage Vref.

In some embodiments, because all the information for determining the digital output word is available after time period T5, the SAR logic 530 determines the digital output word according to principles and aspects discussed elsewhere herein and/or otherwise known to those of skill in the art.

In the exemplary embodiment of FIG. 6, during the time period T6, as a result of a next digital input word from SAR logic 530, CDAC 510 causes voltage Vcomp1 to be equal to or substantially equal to the previous voltage Vcomp1, plus a voltage step, where the magnitude of the voltage step corresponds with the charge of the capacitor of CDAC 510 having value C.

As a result of the voltage Vcomp1 being less than the voltage Vref during time period T5, the SAR logic 530 generates the digital output word corresponding to the analog input voltage Vin.

Because analog input voltage Vin was determined to be greater than the reference voltage Vref during time period T1, the MSB of the digital output word corresponds with that determination. In addition, because the digital input word from SAR logic 530 for CDAC 510 of time period T6 corresponds with the voltage difference between the reference voltage Vref and analog input voltage Vin, and the bits of the digital output word other than the MSB also correspond with the voltage difference between the reference voltage Vref and analog input voltage Vin, the digital input word from SAR logic 530 for CDAC 510 of time period T6 corresponds with the bits of the digital output word other than the MSB.

For example, if, in the example of FIG. 6, the maximum input voltage Vmax is 1 V, and the analog input voltage Vin is 0.74 V, a 4-bit digital word corresponding to the analog input voltage, may be 1011. The value of 1 for the MSB is determined during time period T1. In addition, because the digital input word from SAR logic 530 for CDAC 510 of time period T6 causes the voltage Vcomp1 to be equal to or substantially equal to the analog input voltage Vin, minus four voltage steps, where the magnitude of the voltage steps each correspond with the charge of the capacitor of CDAC 510 having value C, the other bits of the digital output word correspond with a voltage difference between the analog input voltage Vin and the reference voltage Vref, which corresponds digitally to 500. Accordingly, the digital output word is determined to be the expected 1011 because 0111+0100=1011, where 0111 represents the digitized value of the analog input voltage Vin minus four times the voltage corresponding with the charge of the capacitor of CDAC 510 having value C.

Once determined, the SAR ADC 500 represents the digital output word on the output Dout.

Figure 7:
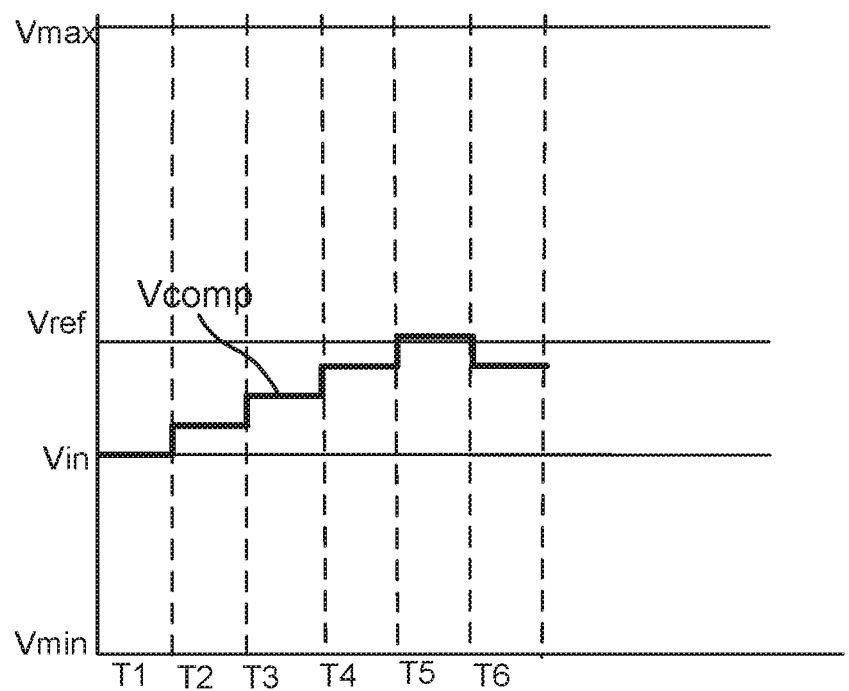
FIG. 7 is a waveform diagram illustrating operation of the SAR ADC of FIG. 5.

FIG. 7 is a waveform diagram illustrating operation of an embodiment of an SAR ADC, such as the SAR ADC 500 of FIG. 5. As shown, analog input voltage Vin is less than a reference voltage Vref and is less than the maximum analog input voltage Vmax. In addition, as shown, reference voltage Vref is substantially equal to half the difference between maximum analog input voltage Vmax and minimum analog input voltage Vmin.

In the example illustrated in FIG. 7, the SAR ADC uses a linear search SAR method. As understood by those of skill in the art, other SAR methods, such as a binary search, may be used.

During the time period T1, the SAR logic 530 causes the switches of CDAC 510 and switch 552 to be connected either to the gnd reference or to the reference voltage Vref and causes switch 554 to be closed. In addition, CDAC 510 causes voltage Vcomp1 to be equal to or substantially equal to the analog voltage Vin. Further, comparator 520 generates a comparison value indicating that the analog voltage Vin is less than the reference voltage Vref. Also, based on the comparison value, SAR logic 530 determines the MSB of the digital output, and determines that subsequent values of voltage Vcomp will be greater than the analog input value Vin.

During the time period T2, as a result of the analog voltage Vin being less than the reference voltage, if the SAR logic 530 caused the switches of CDAC 510 and switch 552 to be connected to the gnd reference, SAR logic 530 causes the switches of CDAC 510 and switch 552 to remain connected to the gnd reference and causes switch 554 to remain closed. Otherwise, as a result of the analog voltage Vin being less than the reference voltage, and the SAR logic 530 having caused the switches of CDAC 510 and switch 552 to be connected to the reference voltage Vref, SAR logic 530 causes the switches of CDAC 510 and switch 552 to be connected to the gnd reference and the voltages of both Vcomp1 and Vcomp2 are decreased by the voltage of reference voltage Vref. Even though the voltages of both Vcomp1 and Vcomp2 are decreased, they are decreased by substantially the same amount, and the result of the comparison is substantially not affected.

Also during the time period T2, as a result of a digital input word from SAR logic 530, CDAC 510 causes voltage Vcomp1 to be equal to or substantially equal to the previous voltage Vcomp1 plus a voltage step, where the magnitude of the voltage step corresponds with the charge of the capacitor of CDAC 510 having value C. Comparator 520 also generates a comparison value indicating that the voltage Vcomp1 is less than the voltage Vref as a result of the voltage Vcomp1 being less than the voltage Vref, and SAR logic 530 determines that the next Vcomp1 is to be greater than the current Vcomp1 as a result of the voltage Vcomp1 being less than the voltage Vref.

As understood by those of skill in the art, in some embodiments, switch of the capacitor of CDAC 510 having value C is not changed and changed again. Instead, the switch of the capacitor of CDAC 510 having value C may remain at the gnd reference.

During the time period T3, as a result of a next digital input word from SAR logic 530, CDAC 510 causes voltage Vcomp to be equal to or substantially equal to the previous voltage Vcomp, plus a voltage step, where the magnitude of the voltage step corresponds with the charge of the capacitor of CDAC 510 having value C. In addition, during time period T3, comparator 520 generates a comparison value indicating that the voltage Vcomp is less than the voltage Vref as a result of the voltage Vcomp being less than the voltage Vref, and SAR logic 530 determines that the next Vcomp is to be greater than the current Vcomp as a result of the voltage Vcomp being less than the voltage Vref.

During the time period T4, as a result of a next digital input word from SAR logic 530, CDAC 510 causes voltage Vcomp to be equal to or substantially equal to the previous voltage Vcomp, plus a voltage step, where the magnitude of the voltage step corresponds with the charge of the capacitor of CDAC 510 having value C. In addition, during time period T4, comparator 520 generates a comparison value indicating that the voltage Vcomp is less than the voltage Vref as a result of the voltage Vcomp being less than the voltage Vref, and SAR logic 530 determines that the next Vcomp is to be greater than the current Vcomp as a result of the voltage Vcomp being greater than the voltage Vref.

During the time period T5, as a result of a next digital input word from SAR logic 530, CDAC 510 causes voltage Vcomp to be equal to or substantially equal to the previous voltage Vcomp, plus a voltage step, where the magnitude of the voltage step corresponds with the charge of the capacitor of CDAC 510 having value C. In addition, during time period T5, comparator 520 generates a comparison value indicating that the voltage Vcomp is greater than the voltage Vref as a result of the voltage Vcomp being greater than the voltage Vref, and SAR logic 530 determines that the next Vcomp is to be less than the current Vcomp as a result of the voltage Vcomp being greater than the voltage Vref.

In some embodiments, because all the information for determining the digital output word is available after time period T5, the SAR logic 530 determines the digital output word according to principles and aspects discussed elsewhere herein and/or otherwise known to those of skill in the art.

In the exemplary embodiment of FIG. 7, during the time period T7, as a result of a next digital input word from SAR logic 530, CDAC 510 causes voltage Vcomp to be equal to or substantially equal to the previous voltage Vcomp, minus a voltage step, where the magnitude of the voltage step corresponds with the charge of the capacitor of CDAC 510 having value C.

As a result of the voltage Vcomp being greater than the voltage Vref during time period T6, the SAR logic 530 generates the digital output word corresponding to the analog input voltage Vin.

Because analog input voltage Vin was determined to be less than the reference voltage Vref during time period T1, the MSB of the digital output word corresponds with that determination. In addition, because the digital input word from SAR logic 530 for CDAC 510 of time period T6 corresponds with the voltage difference between the reference voltage Vref and analog input voltage Vin, and the bits of the digital output word other than the MSB also correspond with the voltage difference between the reference voltage Vref and analog input voltage Vin, the digital input word from SAR logic 530 for CDAC 510 of time period T6 corresponds with the bits of the digital output word other than the MSB.

For example, if, in the example of FIG. 7, the maximum input voltage Vmax is 1 V, and the analog input voltage Vin is 0.26 V, a 4-bit digital word corresponding to the analog input voltage, may be 0100. The value of 0 for the MSB is determined during time period T1. In addition, because the digital input word from SAR logic 530 for CDAC 510 of time period T6 causes the voltage Vcomp to be equal to or substantially equal to the analog input voltage Vin, plus four voltage steps, where the magnitude of the voltage steps each correspond with the charge of the capacitor of CDAC 510 having value C, the other bits of the digital output word correspond with a voltage difference between the analog input voltage Vin and the reference voltage Vref, which corresponds digitally to 100. Accordingly, the digital output word is determined to be the expected 0100 because 1000−0100=0100, where 1000 represents the digitized value of the analog input voltage Vin plus four times the voltage corresponding with the charge of the capacitor of CDAC 510 having value C.

Once determined, the SAR ADC 500 represents the digital output word on the output Dout.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A successive approximation register (SAR) analog to digital converter (ADC), comprising:
    a SAR logic circuit configured to generate a digital input word;
    a DAC, configured to receive the digital input word and an analog input voltage, and to generate a first voltage based on the analog input voltage and the digital input word;
    a comparator, comprising:
    a first input terminal configured to receive the first voltage, and
    a second input terminal configured to receive a second voltage,
    wherein the comparator is configured to generate a comparator output voltage based on the first and second voltages, wherein the comparator output voltage has a value corresponding with a sign of a different between the first and second voltages; and
    a voltage reference generator, configured to generate the second voltage by selecting the second voltage from a plurality of discrete voltage options,
    wherein the SAR logic circuit is further configured to receive the comparator output voltage, and to generate the digital input word for the DAC based on one or more comparator output voltages received from the comparator, and
    wherein the voltage reference generator is configured to select the second voltage based at least in part on whether the analog input voltage is greater than a reference voltage.

2. The SAR ADC of claim 1, wherein the SAR logic is configured to determine an MSB of a digital output word by comparing the analog input voltage with the reference voltage.

3. The SAR ADC of claim 1, wherein the SAR logic is further configured to generate a digital output word based on a plurality of comparator output voltages received from the comparator, wherein the digital output word represents the value of the analog input voltage.

4. A successive approximation register (SAR) analog to digital converter (ADC), comprising:
    a SAR logic circuit configured to generate a digital input word;
    a DAC, configured to receive the digital input word and an analog input voltage, and to generate a first voltage based on the analog input voltage and the digital input word,
    a comparator, comprising:
    a first input terminal configured to receive the first voltage, and
    a second input terminal configured to receive a second voltage,
    wherein the comparator is configured to generate a comparator output voltage based on the first and second voltages, wherein the comparator output voltage has a value corresponding with a sign of a different between the first and second voltages; and
    a voltage reference generator, configured to generate the second voltage by selecting the second voltage from a plurality of discrete voltage options,
    wherein the SAR logic circuit is further configured to receive the comparator output voltage, and to generate the digital input word for the DAC based on one or more comparator output voltages received from the comparator,
    wherein the SAR logic circuit is configured to determine whether the digital input word causes the DAC to generate the first voltage such that the first voltage is greater than or is less than the analog input voltage based on whether the analog input voltage is determined to be less than or greater than a reference voltage by the comparator.

5. A successive approximation register (SAR) analog to digital converter (ADC), comprising:
    a SAR logic circuit configured to generate a digital input word;
    a DAC, configured to receive the digital input word and an analog input voltage, and to generate a first voltage based on the analog input voltage and the digital input word,
    a comparator, comprising:
    a first input terminal configured to receive the first voltage, and
    a second input terminal configured to receive a second voltage,
    wherein the comparator is configured to generate a comparator output voltage based on the first and second voltages, wherein the comparator output voltage has a value corresponding with a sign of a different between the first and second voltages; and
    a voltage reference generator, configured to generate the second voltage by selecting the second voltage from a plurality of discrete voltage options,
    wherein the SAR logic circuit is further configured to receive the comparator output voltage, and to generate the digital input word for the DAC based on one or more comparator output voltages received from the comparator,
    wherein the first voltage is substantially equal to the analog input voltage plus a voltage determined by the digital input word.

6. The SAR ADC of claim 5, wherein the DAC comprises a plurality of capacitors and a plurality of switches, wherein each of the switches is connected to a particular one of the capacitors, is selectively connected to either of a ground voltage and a reference voltage, and is configured to selectively connect the particular capacitor to either of the ground voltage and the reference voltage.

7. The SAR ADC of claim 6, wherein the SAR logic is configured to cause the DAC to generate the first voltage such that the first voltage is equal to the analog input voltage, wherein while the first voltage is generated, the switches of the DAC are connected to the ground voltage and the second voltage is a lesser of first and second voltage options.

8. The SAR ADC of claim 7, wherein the SAR logic is configured to, in response to the analog input voltage being greater than the reference voltage, cause the switches of the DAC to become connected to the reference voltage and the second voltage to become a greater of the first and second voltage options.

9. The SAR ADC of claim 6, wherein the SAR logic is configured to cause the DAC to generate the first voltage such that the first voltage is equal to the analog input voltage, wherein while the first voltage is generated, the switches of the DAC are connected to the reference voltage and the second voltage is a greater of first and second voltage options.

10. The SAR ADC of claim 9, wherein the SAR logic is configured to, in response to the analog input voltage being less than the reference voltage, cause the switches of the DAC to become connected to the ground voltage and the second voltage to become a lesser of the first and second voltage options.

11. A method of determining a digital output word having a value corresponding with an analog input value with a successive approximation register (SAR) analog to digital converter (ADC), the method comprising:
with a SAR logic circuit of the SAR ADC, generating a digital input word;
with a DAC of the SAR ADC:
receiving the digital input word and an analog input voltage, and
generating a first voltage based on the analog input voltage and the digital input word;
with a comparator of the SAR ADC:
receiving the first voltage at a first input terminal, and
receiving a comparison voltage, and
generating a second voltage based on the first voltage and on the comparison voltage, wherein the second voltage has a value corresponding with a sign of a difference between the first voltage and the comparison voltage;
with a voltage generator, generating the comparison voltage by selecting the comparison voltage from a plurality of discrete voltage options;
with the SAR logic circuit of the SAR ADC:
receiving the second voltage,
generating the digital input word for the DAC based on one or more comparator output voltages received from the comparator; and
generating the digital output word based on the comparator output voltages, wherein the digital output word represents the value of the analog input voltage,
wherein generating the comparison voltage comprises selecting the comparison voltage based at least in part on whether the analog input voltage is greater than a reference voltage.

12. The method of claim 11, further comprising, with the SAR logic, determining an MSB of the digital output word by comparing the analog input voltage with the comparison voltage.

13. The method of claim 11, further comprising, with the SAR logic, determining whether the digital input word causes the DAC to generate the first voltage such that the first voltage is greater than or is less than the analog input voltage based on whether the analog input voltage is determined to be less than or greater than the reference voltage by the comparator.

14. A method of determining a digital output word having a value corresponding with an analog input value with a successive approximation register (SAR) analog to digital converter (ADC), the method comprising:
with a SAR logic circuit of the SAR ADC, generating a digital input word;
with a DAC of the SAR ADC:
receiving the digital input word and an analog input voltage, and
generating a first voltage based on the analog input voltage and the digital input word;
with a comparator of the SAR ADC:
receiving the first voltage at a first input terminal, and
receiving a comparison voltage, and
generating a second voltage based on the first voltage and on the comparison voltage, wherein the second voltage has a value corresponding with a sign of a difference between the first voltage and the comparison voltage;
with a voltage generator, generating the comparison voltage by selecting the comparison voltage from a plurality of discrete voltage options;
with the SAR logic circuit of the SAR ADC;
receiving the second voltage,
generating the digital input word for the DAC based on one or more comparator output voltages received from the comparator; and
generating the digital output word based on the comparator output voltages, wherein the digital output word represents the value of the analog input voltage,
wherein the first voltage is substantially equal to the analog input voltage plus a voltage determined by the digital input word.

15. The method of claim 14, wherein the DAC comprises a plurality of capacitors and a plurality of switches, wherein each of the switches is connected to a particular one of the capacitors, and is selectively connected to either of a ground voltage and a reference voltage, wherein the method further comprises, with the switches of the DAC, selectively connecting each of the capacitors of the DAC to either the ground voltage or the reference voltage.

16. The method of claim 15, further comprising, with the SAR logic, causing the DAC to generate the first voltage such that the first voltage is equal to the analog input voltage, wherein while the first voltage is generated, the switches of the DAC are connected to the ground voltage and the comparison voltage is a lesser of first and second voltage options.

17. The method of claim 16, further comprising, with the SAR logic, in response to the analog input voltage being greater than the reference voltage, causing the switches of the DAC to become connected to the reference voltage and the comparison voltage to become a greater of the first and second voltage options.

18. The method of claim 16, further comprising, with the SAR logic, in response to the analog input voltage being less than the reference voltage, causing the switches of the DAC to remain connected to the ground voltage and the comparison voltage to remain the lesser of the first and second voltage options.

19. The method of claim 15, further comprising, with the SAR logic, causing the DAC to generate the first voltage such that the first voltage is equal to the analog input voltage, wherein while the first voltage is generated, the switches of the DAC are connected to the reference voltage and the comparison voltage is a greater of first and second voltage options.

20. The method of claim 19, further comprising, with the SAR logic, in response to the analog input voltage being less than the reference voltage, causing the switches of the DAC to become connected to the ground voltage and the comparison voltage is a lesser of the first and second voltage options.

21. The method of claim 19, further comprising, with the SAR logic, in response to the analog input voltage being less than the reference voltage, causing the switches of the DAC to become connected to the reference voltage and the comparison voltage is the greater of the first and second voltage options.

\* \* \* \* \*